United States Patent [19]
Jun et al.

[11] Patent Number: 5,566,079
[45] Date of Patent: Oct. 15, 1996

[54] PARAMETERIZED GENERIC MULTIPLIER COMPLIER

[75] Inventors: Henry K. Jun, San Jose; Chun L. Liu, Milpitas; Lin Yang, Fremont, all of Calif.; Kazuyoshi Moriya, Edogawa-ku, Japan

[73] Assignee: VLSI Technology, Inc., San Jose, Calif.

[21] Appl. No.: 974,457

[22] Filed: Nov. 12, 1992

[51] Int. Cl.⁶ .................................................. G06F 17/50
[52] U.S. Cl. .......................... 364/491; 364/490; 364/489; 364/488
[58] Field of Search .................................. 364/488, 489, 364/490, 491

[56] References Cited

U.S. PATENT DOCUMENTS

| | | | |
|---|---|---|---|
| 4,703,435 | 10/1987 | Darringer et al. | 364/489 |
| 4,827,427 | 5/1989 | Hyduke | 364/489 |
| 4,831,524 | 5/1989 | Furgerson | 364/488 |
| 4,922,432 | 5/1990 | Kobayashi | 364/490 |
| 4,967,367 | 10/1990 | Piednoir | 364/489 |
| 5,005,136 | 4/1991 | Van Berkel et al. | 364/490 |
| 5,150,308 | 9/1992 | Hooper et al. | 364/489 |
| 5,197,016 | 3/1993 | Sugimoto et al. | 364/490 |
| 5,224,055 | 6/1993 | Grundy et al. | 364/488 |
| 5,278,769 | 1/1994 | Bair et al. | 364/490 |
| 5,282,146 | 1/1994 | Aihara et al. | 364/489 |
| 5,287,289 | 2/1994 | Kageyama et al. | 364/489 |
| 5,299,137 | 3/1994 | Kingsley | 364/489 |

OTHER PUBLICATIONS

Mainsail Documentation User's Guide, Mailsail Overview, Master Index, Mar. 24, 1989, Xidak, Inc., Menlo Park, CA (Table of Contents only).

Compass Design Automation–V8R3, Datapath Complier, 1991, (Table of Contents only).

*Primary Examiner*—Vincent N. Trans
*Attorney, Agent, or Firm*—Burns, Doane, Swecker & Mathis

[57] ABSTRACT

A method for producing a circuit layout comprising the steps of establishing high-level input parameters which identify input/output characteristics and high-level functional parameters of a data path, inputting the input parameters to a compiler, the compiler performing steps of creating a data path netlist by selecting data path components in response to the established high-level input parameters; and automatically selecting control logic for the data path components. The data path netlist is a high-level netlist of Boolean logic which can then easily be translated into a gate level implementation of the circuit layout.

25 Claims, 14 Drawing Sheets

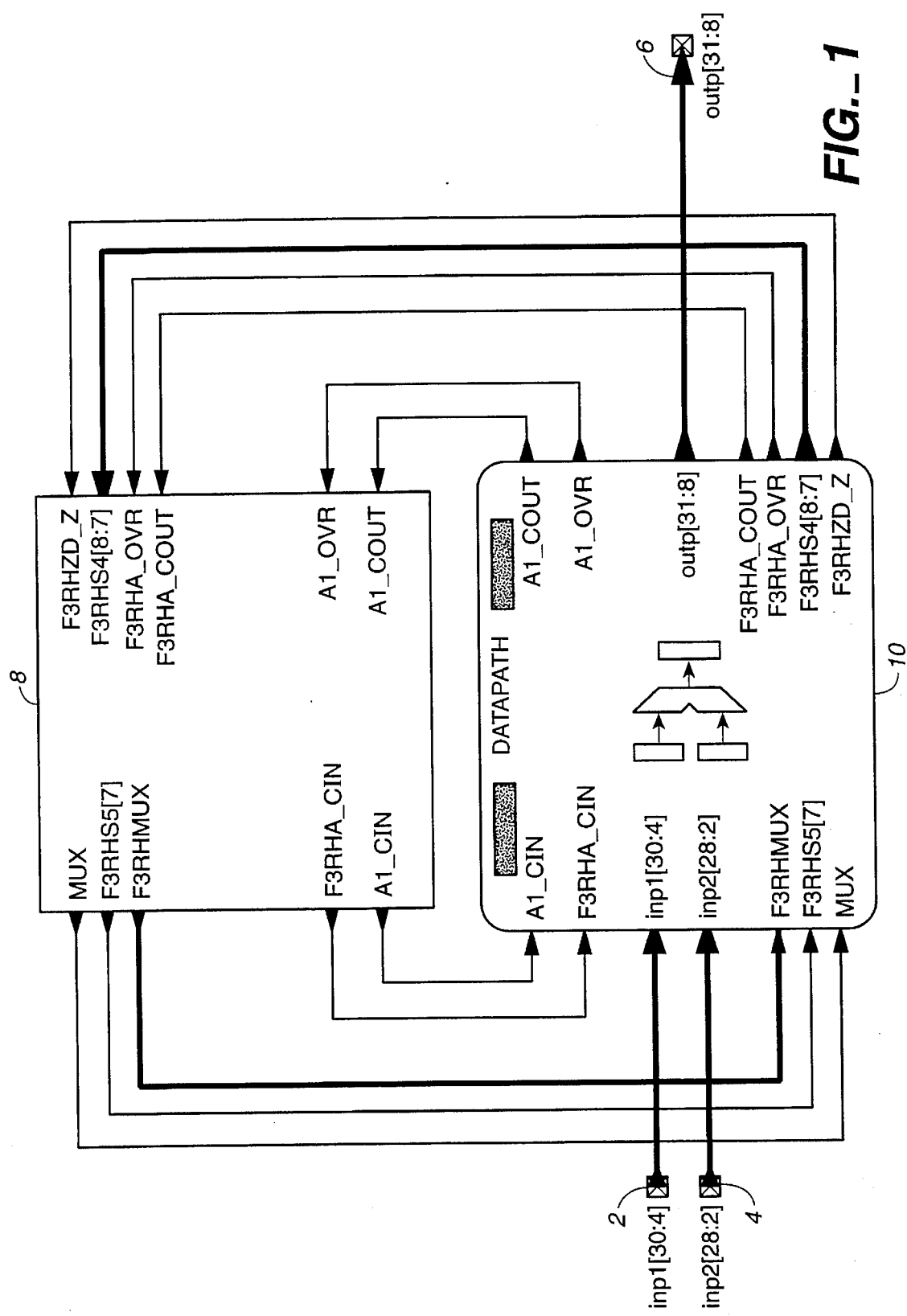
FIG._1

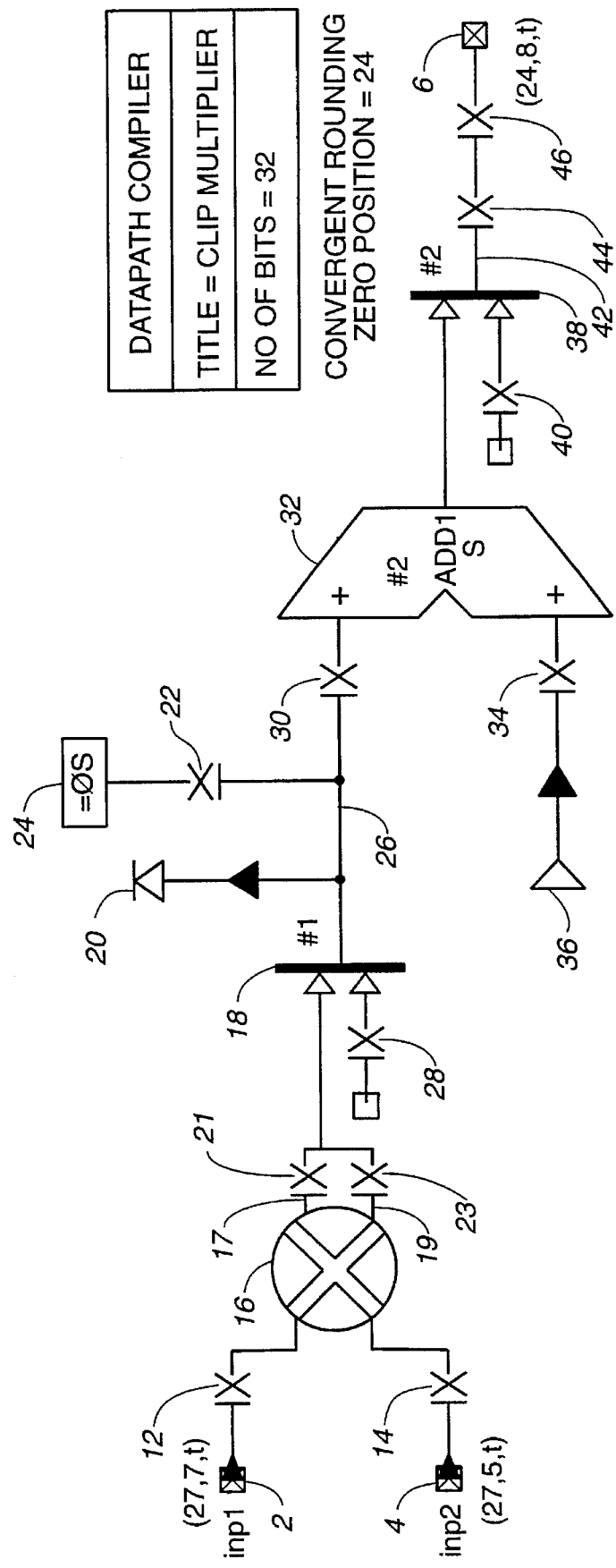
FIG._2

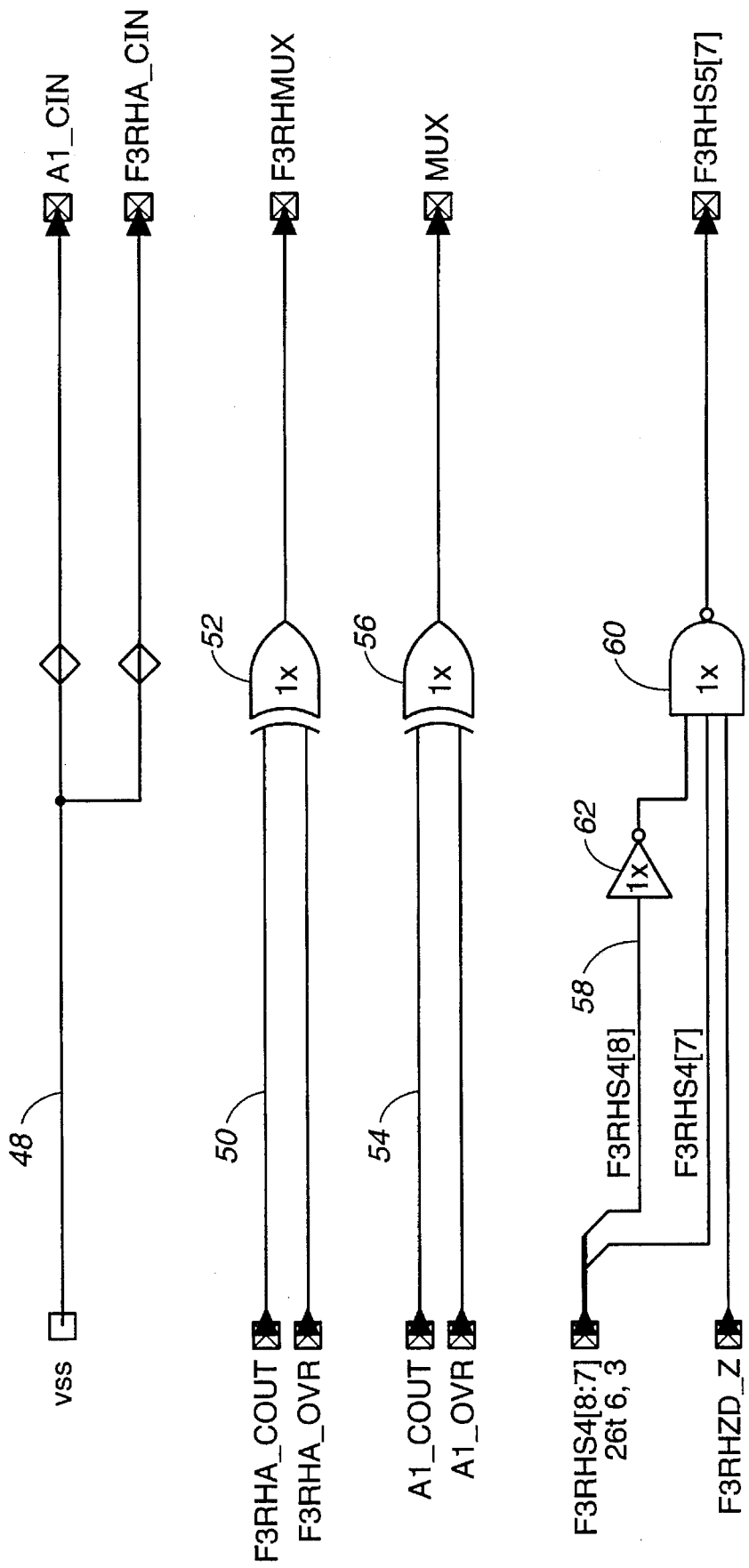
FIG._3

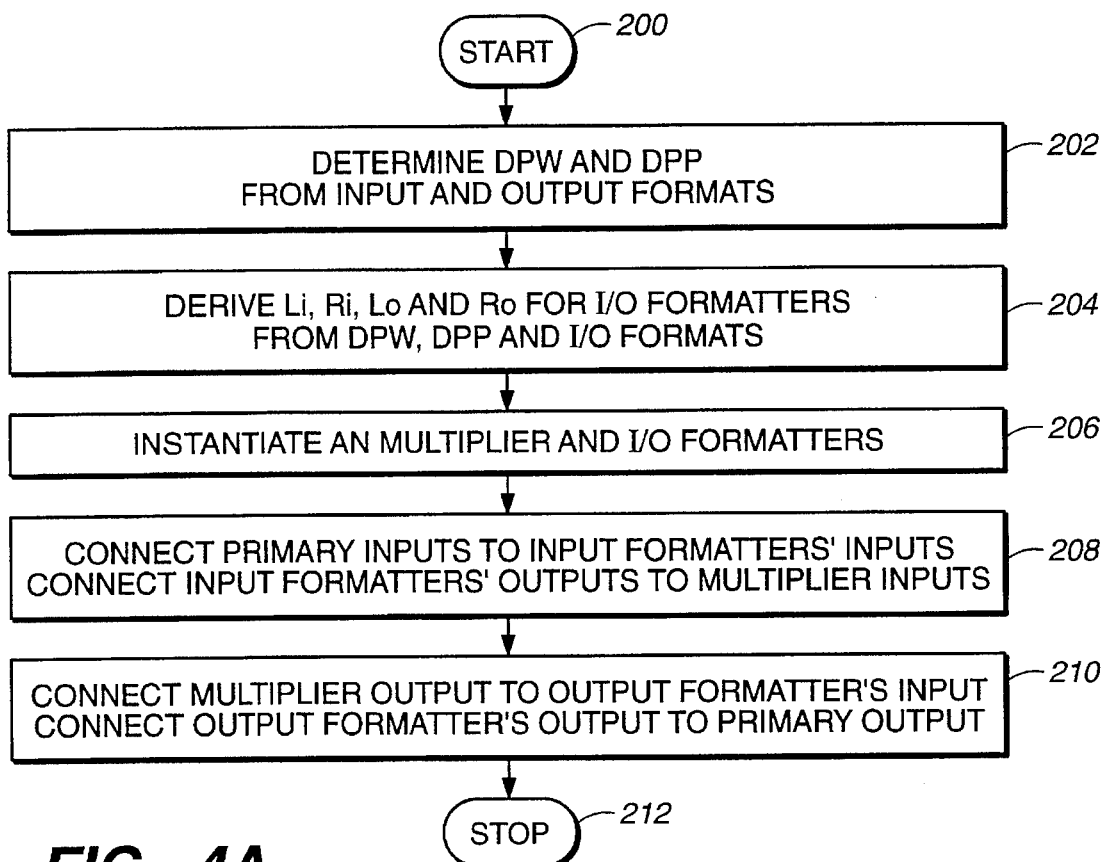
*FIG._4A*
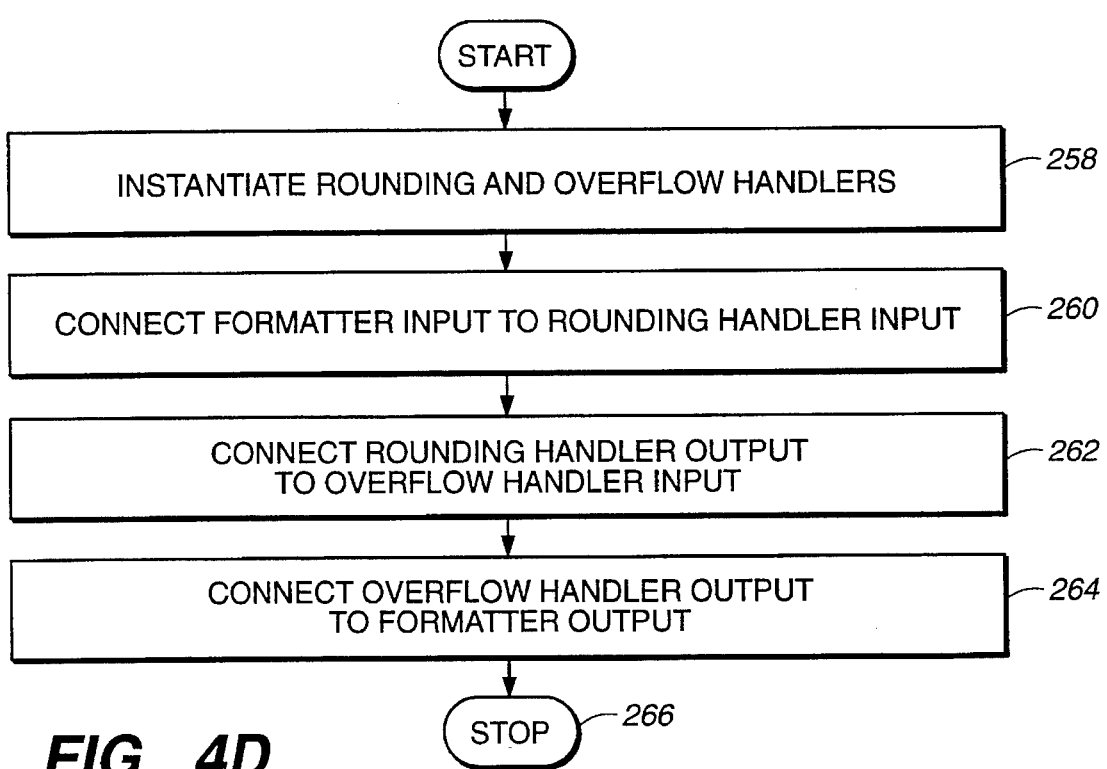
*FIG._4D*

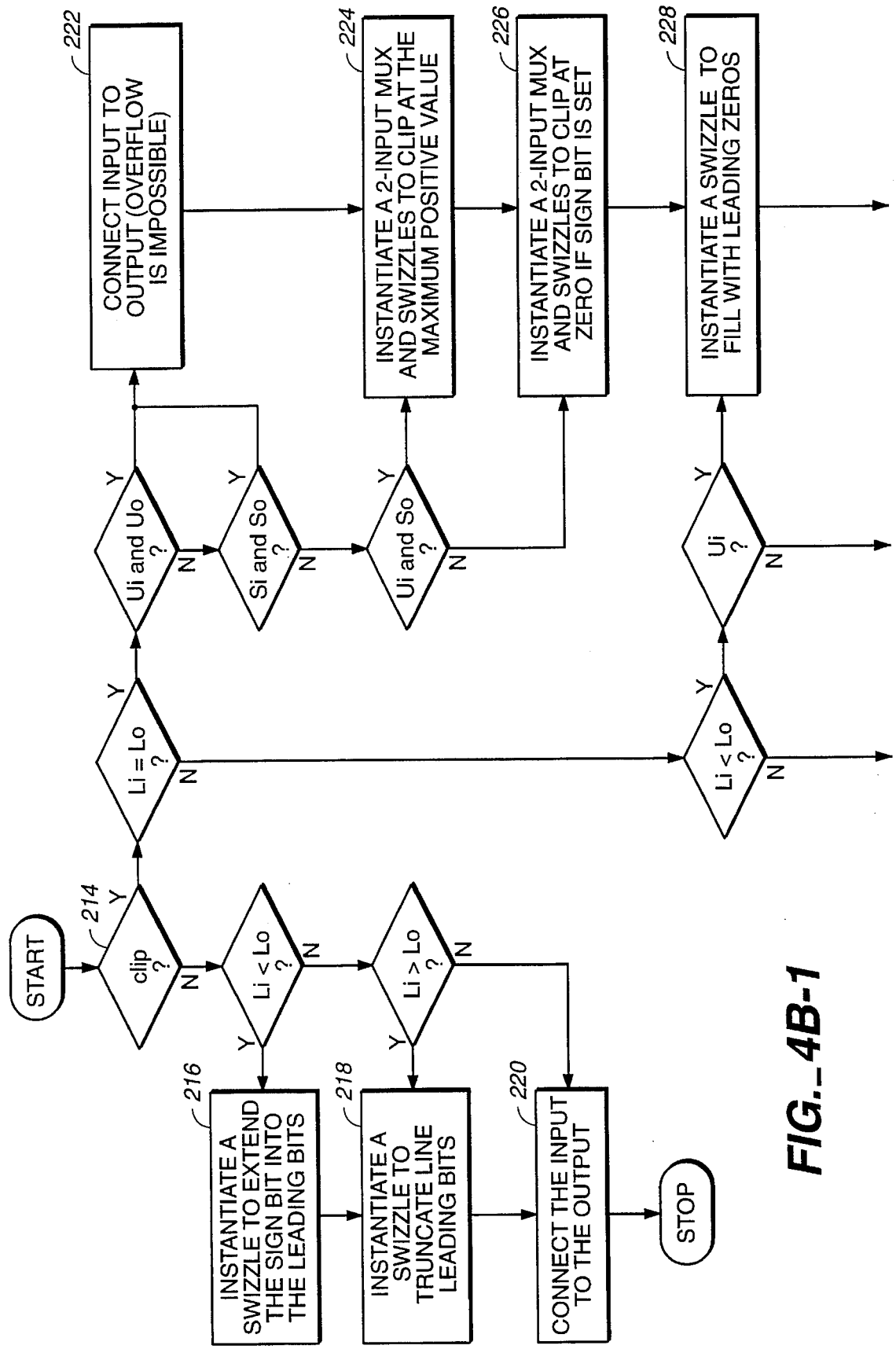
FIG._4B-1

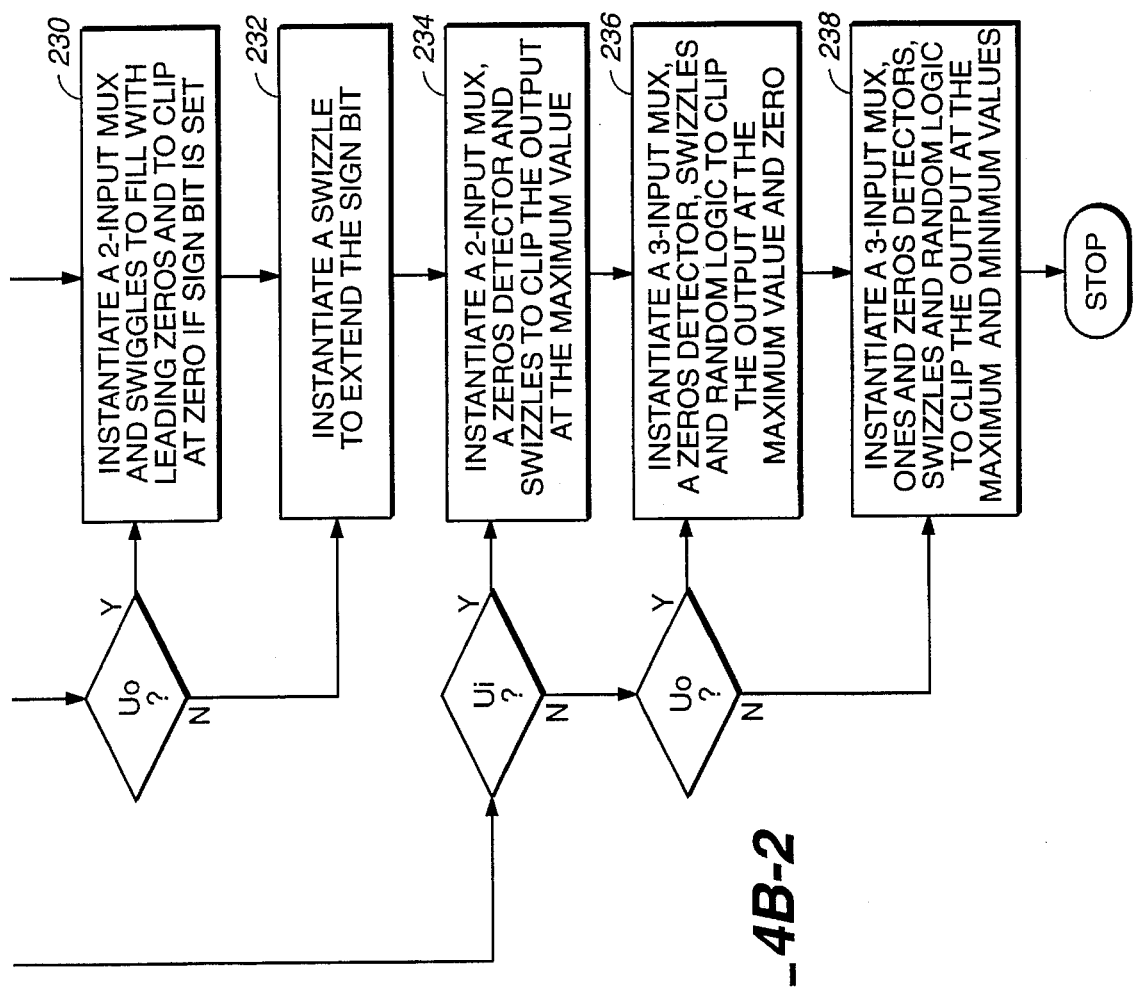
FIG._4B-2
FIG._4B

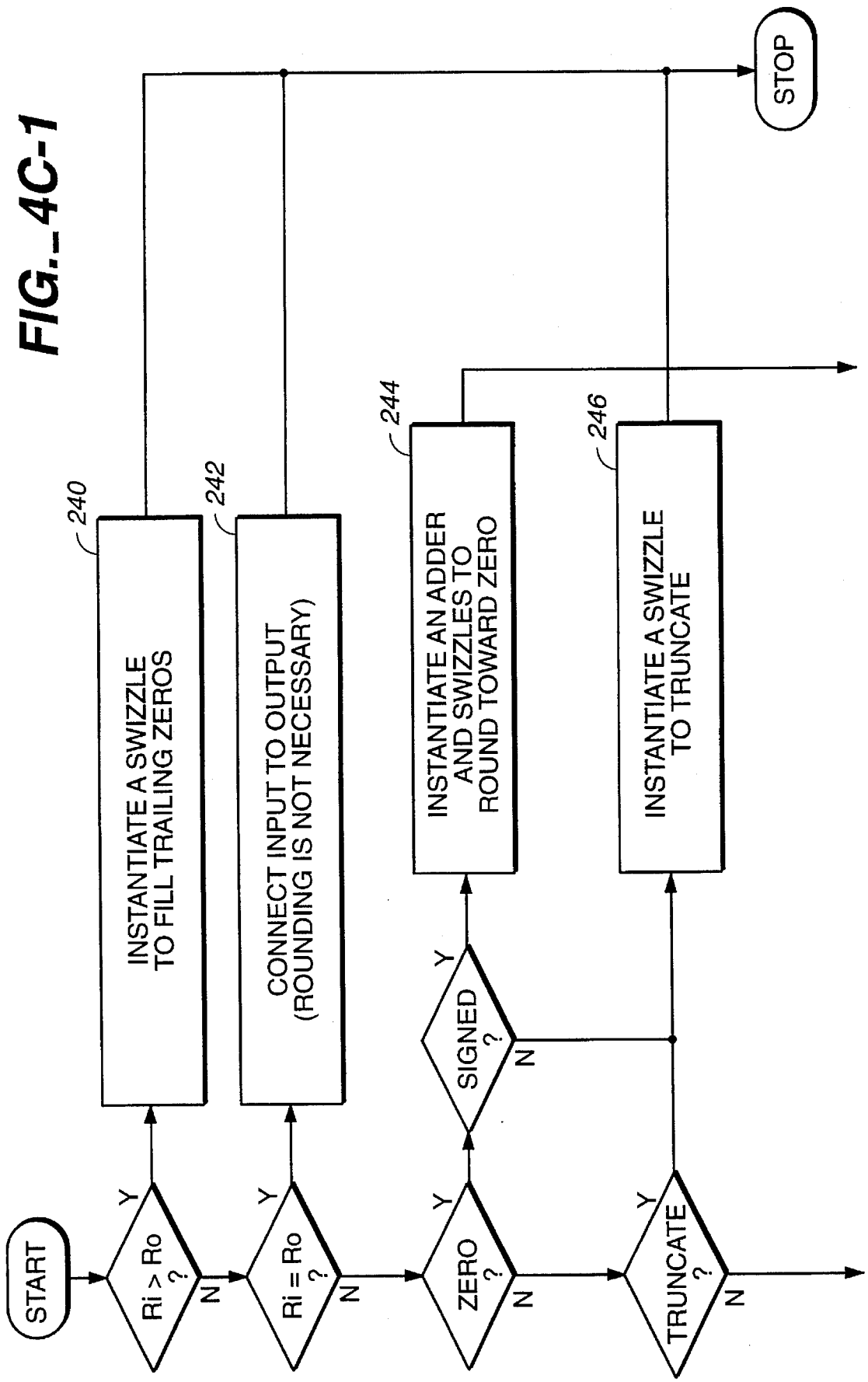
FIG._4C-1

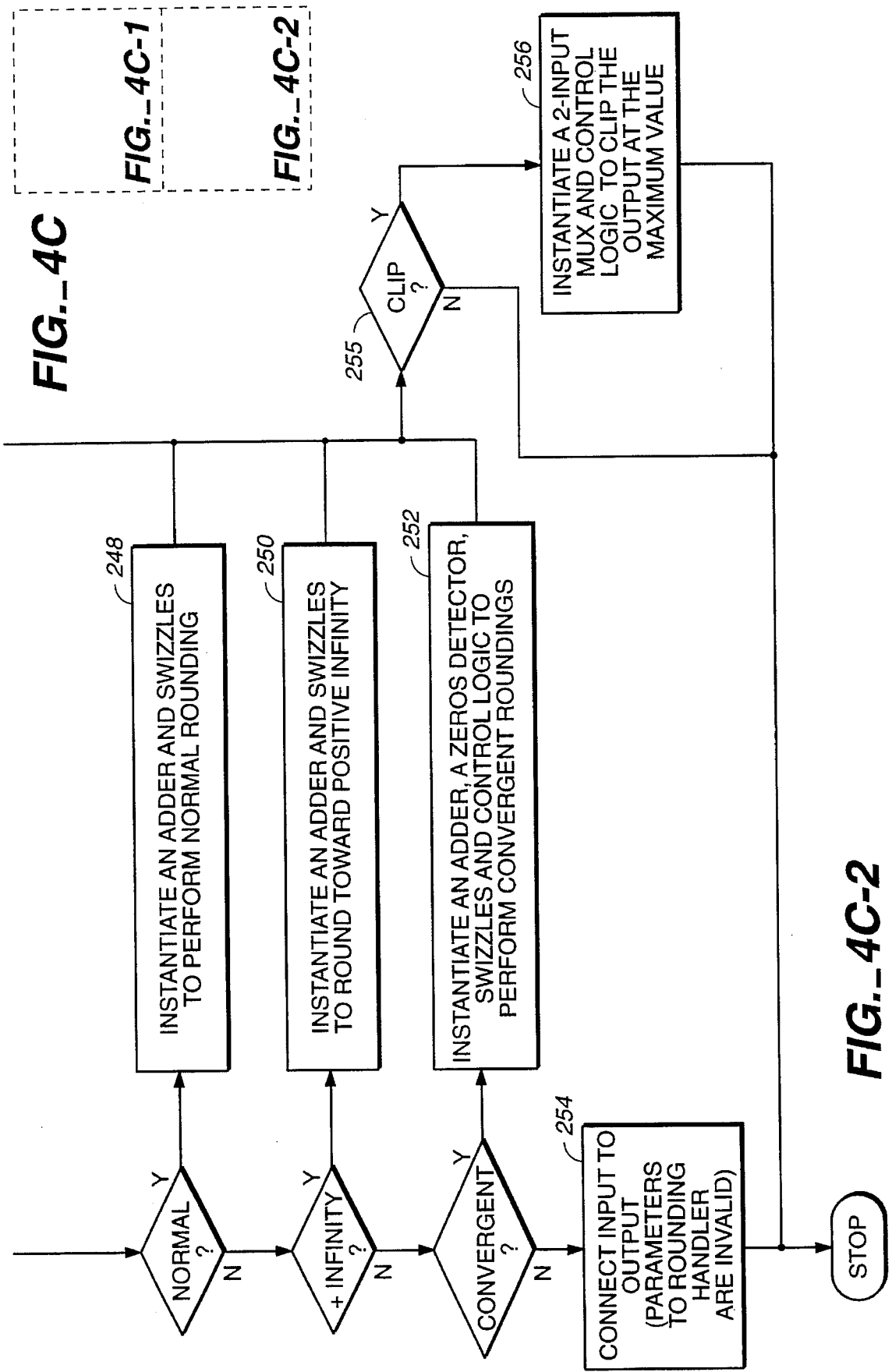

$Ri > Ro:$ Li:Ri (Ri−Ro)l Ro−
IN ☐—IX——☐ OUT
FIG._5A
$Ri = Ro:$ IN ☐————☐ OUT
FIG._5B
TRUNCATE: Li:Ro Ro−
IN ☐—IX——☐ OUT
FIG._5C
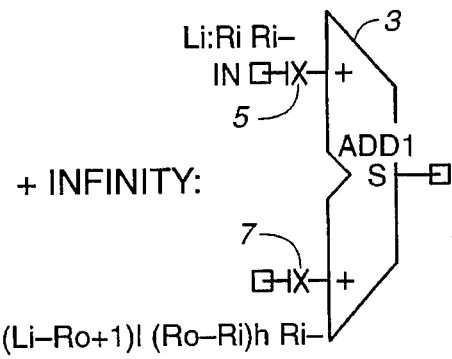
+ INFINITY:
(Li−Ro+1)l (Ro−Ri)h Ri−
FIG._5D
ZERO (SIGNED):
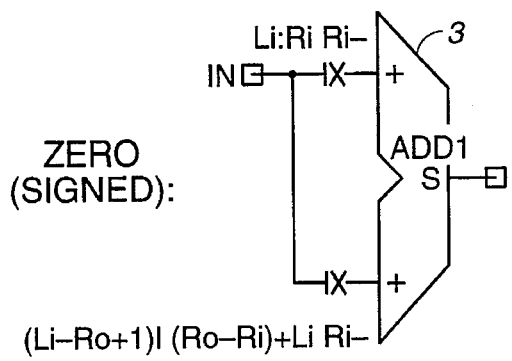
(Li−Ro+1)l (Ro−Ri)+Li Ri−
FIG._5E
ZERO (UNSIGNED): Li:Ro Ro−
IN ☐—IX——☐ OUT
FIG._5F
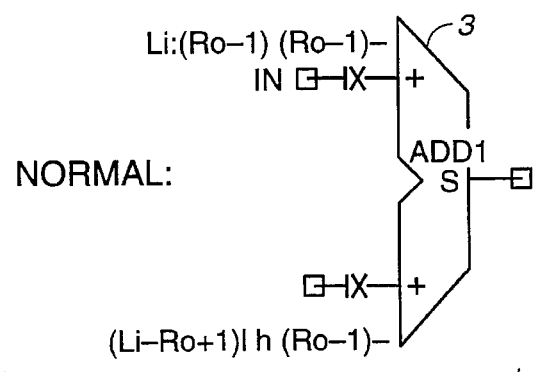
NORMAL:
(Li−Ro+1)l h (Ro−1)−
FIG._5G
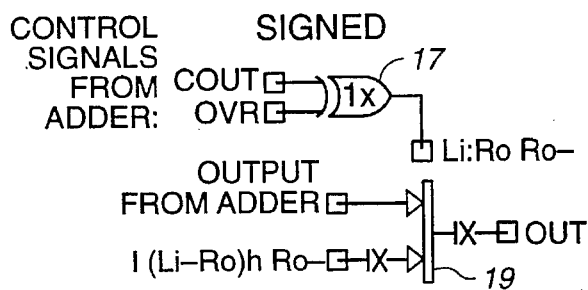
FIG._5I
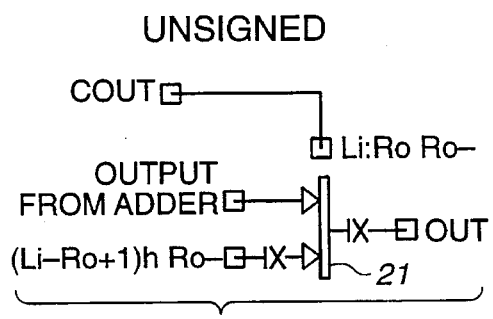
FIG._5J

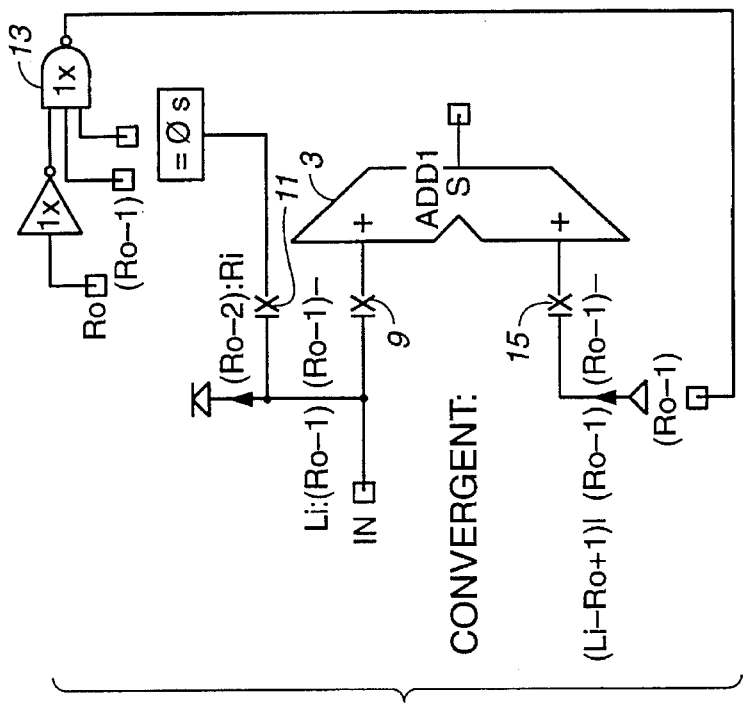
FIG._5H
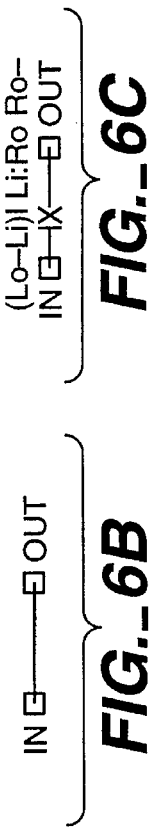
FIG._6C
FIG._6B
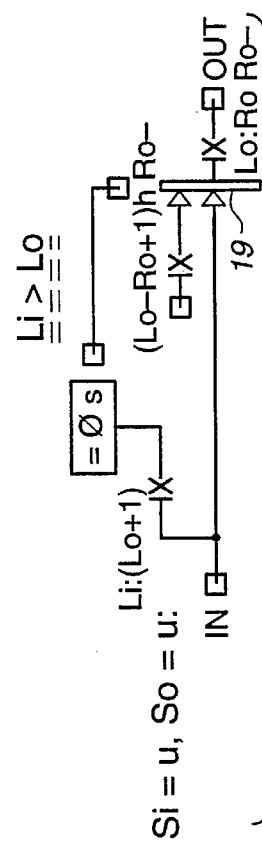
FIG._6A

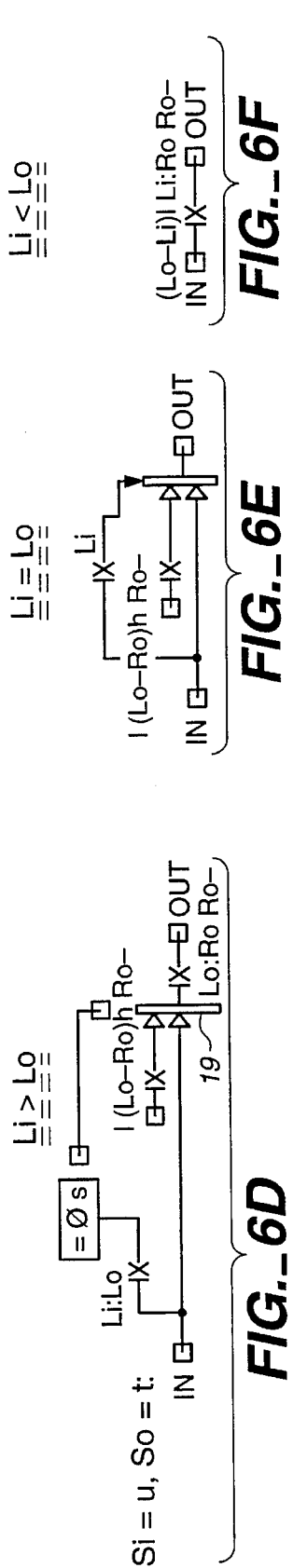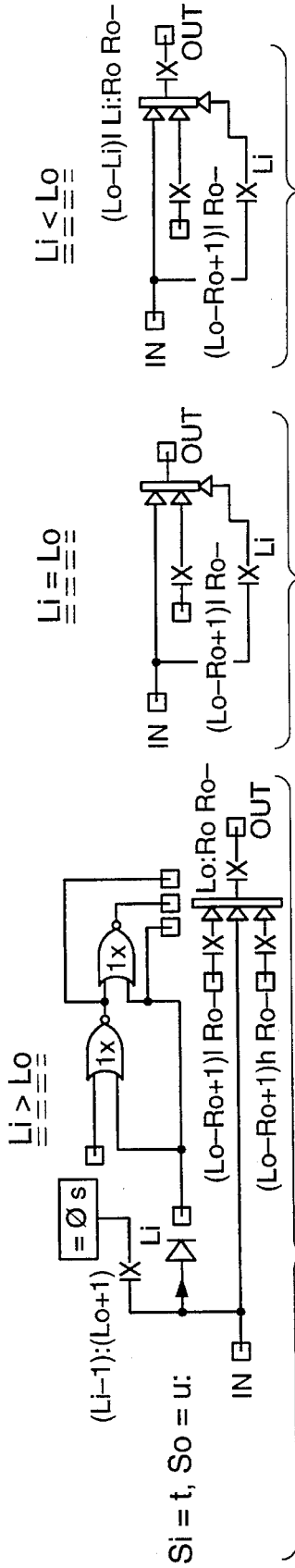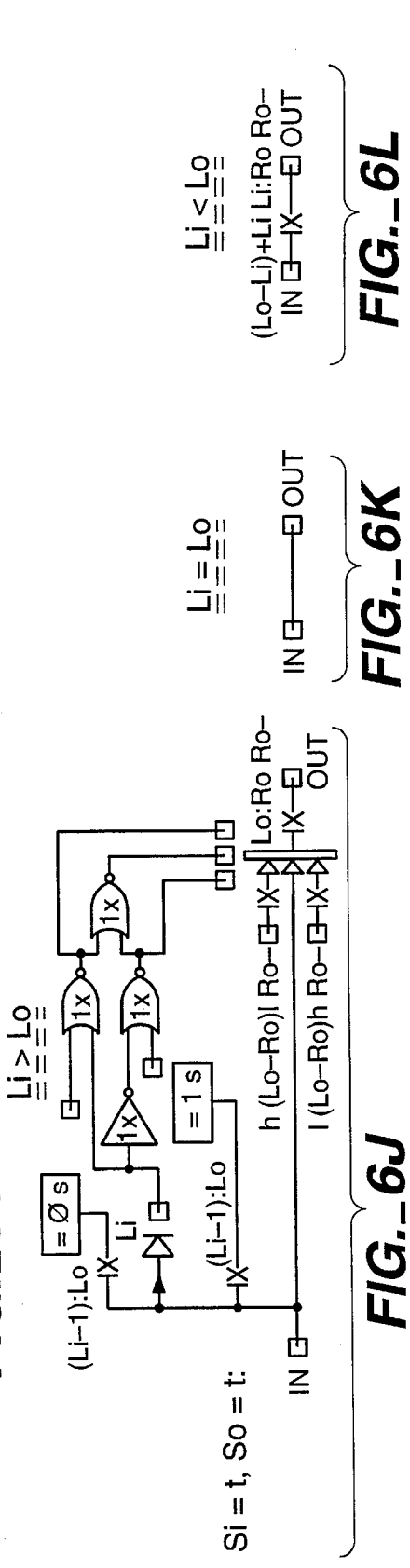

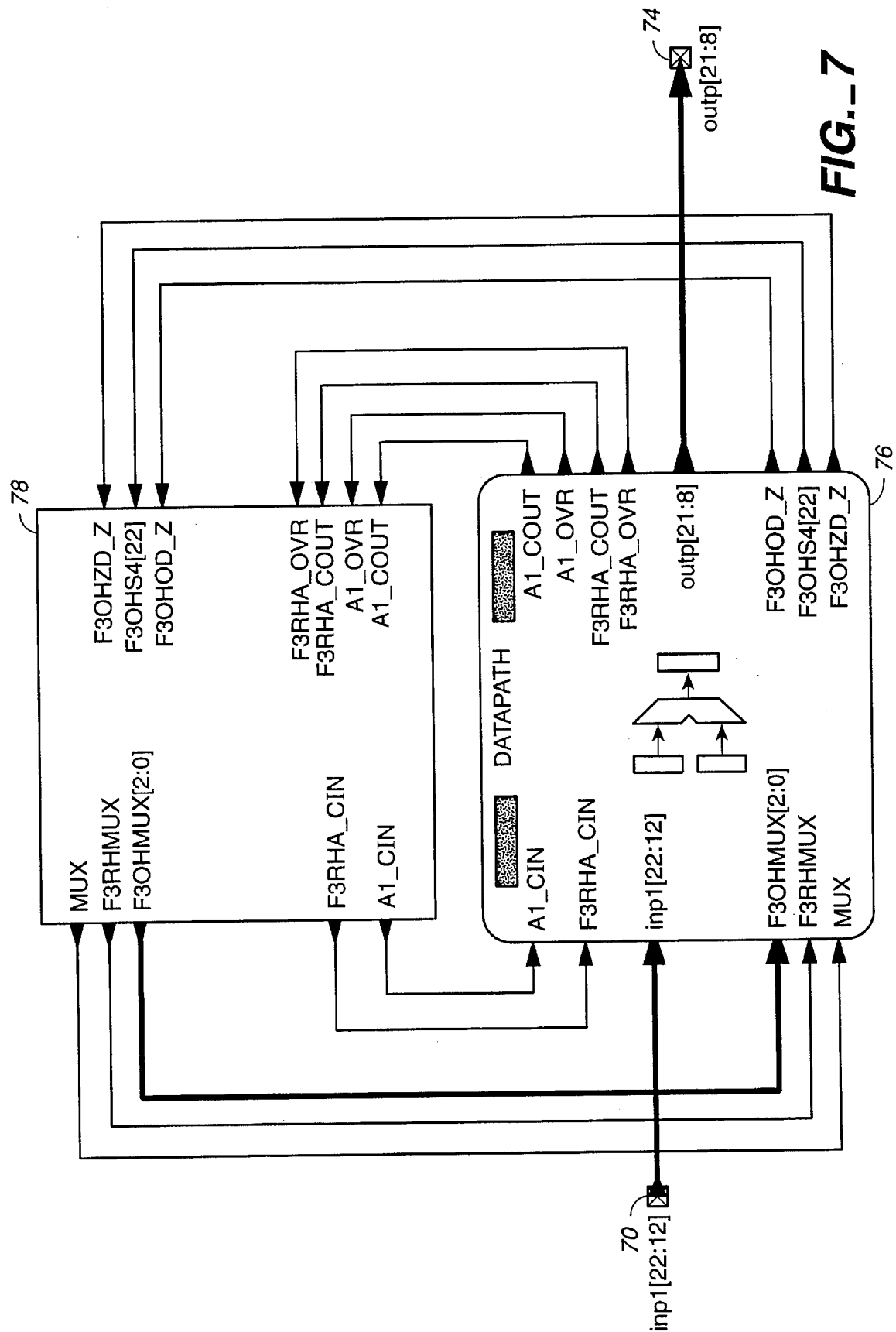
FIG._7

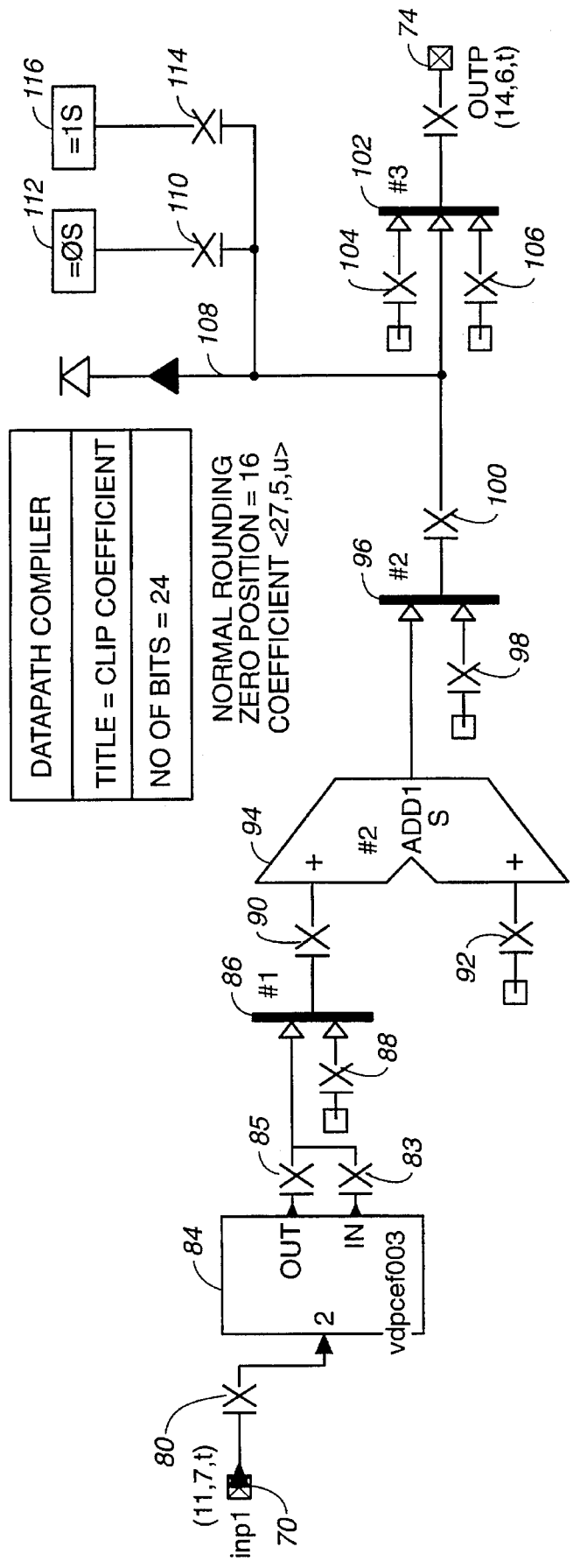
FIG._8

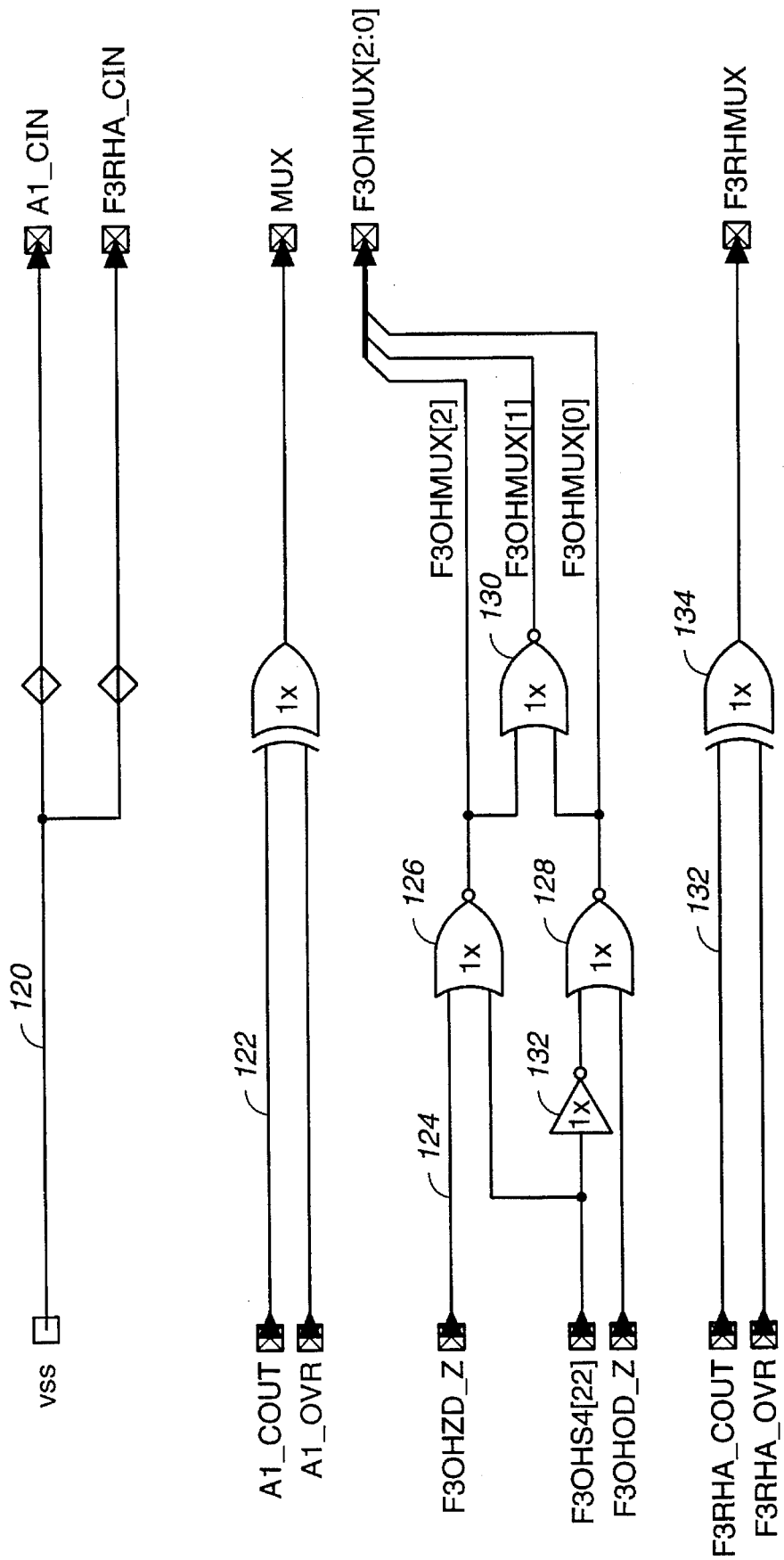
FIG._9

PARAMETERIZED GENERIC MULTIPLIER COMPLIER

BACKGROUND OF THE INVENTION

1. Field of the Invention

The present invention relates generally to integrated circuit design and fabrication. More particularly, the invention relates to integrated circuit fabrication by specifying a high-level functional description of a multiplier or coefficient generator circuit design.

2. State of the Art

Automated synthesis of a circuit layout design in response to user selected inputs is well known. Such automated synthesis typically requires the designer to prepare a textual description of the circuit layout using a hardware description language (HDL) wherein all functions needed to implement a desired data path in the circuit layout must be specified in detail. Further, the hardware description language must be used to specify all control functions needed by the data path to properly implement processing along the data path.

For example, a circuit layout may include a data path wherein specified bit locations of a first word are to be combined (e.g., added or multiplied) with specified bit locations of a second word to produce an output. The designer may want to specify that the output should be rounded to the nearest integer value. Using a hardware description language, the designer must describe the Boolean functions (e.g., AND, OR, NOR functions) required to implement the addition of the first and second words. The designer must also describe the Boolean functions required to implement the rounding function. Further, Boolean control logic functions must be described to control the data path. For example, Boolean functions must be described for detecting the output of the adding operation so that this output is rounded up or rounded down (e.g., a fractional value of 0.7 would be rounded up while a fractional value of 0.3 would be rounded down).

In addition to describing the Boolean functions needed to implement the general data path functions and control logic functions, the designer must also examine the circuit in which the data path will be used to identify data path inputs. Where incompatibilities exist among the various inputs (e.g., different word lengths, different data formats and so forth), the designer must describe Boolean functions to correlate the inputs so that they can be properly combined. Similarly, the designer must specify Boolean functions to correlate the adding function output with an input to the rounding function, and to correlate the data path output with the circuit layout requirements.

Once the designer has described all behavioral aspects of the data path and attendant control logic, the description is input to a compiler which synthesizes a netlist of Boolean primitive gates (e.g., AND, OR, NOR gates). The netlist is produced by accessing a standard cell library of Boolean gates in the compiler's memory. The netlist is then translated into a transistor gate-level implementation for circuit layout fabrication.

The complex hardware description required for the relatively simple case of adding two words and rounding the resultant output requires tedious, time-consuming efforts by the designer. These efforts increase dramatically with an increase in data path complexity (and attendant increase in control logic complexity). The complexity of this conventional design and fabrication process makes adaptations of the data path to different circuit layouts difficult. The designer must re-describe the entire data path and control logic for each new implementation (e.g., changes in I/O characteristics and/or functional characteristics such as performance or operation). Further, the burden is on the designer to ensure that all behavioral aspects of the data path are accurately and fully described to ensure proper operation of the data path. Failure to describe all behavioral aspects of the data path and control logic can result in meaningless data path outputs. For example, a failure to describe the Boolean functions needed to render two inputs compatible, or the Boolean functions needed to account for adder overflow (i.e., where a maximum value of adder output is exceeded) can result in improper, meaningless data path outputs.

SUMMARY OF THE INVENTION

The present invention is directed to systems and methods for circuit design and fabrication which permit use of a relatively high-level functional description of a data path. In accordance with the present invention, a designer describes a data path merely by specifying input parameters which identify I/O characteristics and high-level functional characteristics of the data path. The designer need not specify all behavioral characteristics of the data path and control logic as in conventional methods described above.

The present invention significantly reduces the complexity of a circuit layout description and therefore significantly reduces overall design time. Adaptations of a circuit design to different implementations can be achieved quickly and easily with only minimal effort by the designer. For example, a very simple data path designed for combining two inputs of compatible (i.e., similar) data formats can be easily and quickly reconfigured as a data path for combining any number of inputs having incompatible data formats. Further, because the designer need only specify input parameters representing high-level functional characteristics of the data path, the designer need not be concerned with specifying all behavioral aspects of the data path which are necessary to ensure proper, meaningful outputs.

In general, the invention relates to a method for producing a circuit layout for performing multiplication or coefficient generation, comprising the steps of establishing input parameters which identify input/output characteristics and functional parameters of a data path; inputting said input parameters to a compiler, said compiler performing the steps of creating a high-level data path netlist by automatically selecting high-level data path components from a data path library in response to said established input parameters and by automatically selecting control logic in response to said selected data path components for controlling said data path components.

BRIEF DESCRIPTION OF THE DRAWINGS

Other objects and advantages of the present invention will become more apparent from the following detailed description of preferred embodiments when read in conjunction with the accompanying drawings wherein like elements are designated by like numerals and wherein:

FIG. 1 illustrates control path and data path portions of a digital signal processing (DSP) block representing a multiplier circuit with primary input and output bit specifications and their interconnections;

FIGS. 2 and 3 illustrate details of the data path and control data portions, respectively of the FIG. 1 example;

FIGS. 4(a)–(d) illustrate an exemplary flow chart for implementing a preferred embodiment;

FIGS. 5(a)–(j) and 6(a)–(l) illustrate exemplary data path and control logic instances which are accessible by a compiler in accordance with the present invention; and FIGS. 7 through 9 illustrate an example of a compiled coefficient multiplier circuit having data path and control path portions.

DETAILED DESCRIPTION OF THE PREFERRED EMBODIMENTS

Exemplary systems and methods for implementing the present invention will be described in detail with respect to exemplary circuit schematics such as the circuit illustrated in FIGS. 1 through 3. In accordance with the present invention, the data path 10 shown in FIG. 1 can be used to form part of a larger circuit layout. FIG. 1 illustrates the netlist of data path and control logic interconnections for implementing a multiplier circuit. In accordance with the present invention, the FIG. 1 multiplier circuit can be designed and fabricated merely by establishing input parameters which identify high level input/output characteristics (i.e., for inputs 2, 4 and output 6) and which identify functional parameters of the data path 10. The control logic and netlist interconnections need not be specified by the designer, yet reliable accurate circuit fabrication and operation can be achieved.

The establishment of input parameters which identify the input/output characteristics of the data path includes steps of defining the number of data path inputs and outputs, defining the number of bits per word for each data path input/output and defining the data format for each data path input/output. For example, the data format of each data word can be specified by designating whether the word is a floating point data word or a fixed point data word (i.e., the decimal point position for each word, DPP). The left-most bit location for the input (i.e., $L_i$) and output (i.e., $L_o$) and the right-most bit location for the input (i.e., $R_i$) and output (i.e., $R_o$) can be derived from this information for each circuit instance. Whether each word is signed or unsigned is also specified for each input (i.e., $S_i$) and for each output (i.e., $S_o$). A signed word is a word which can be positive or negative (e.g., two's complement format), while an unsigned word is limited to being designated either positive or zero.

As mentioned above, the designer must also establish input parameters which identify functional parameters of the data path. This step of establishing functional parameters includes the step of specifying the desired functional processing parameters of the data path inputs, such as a primary function (e.g., multiplying) and associated functions for the primary function, such as clipping, rounding or truncation.

The FIG. 1 data path is a multiplication data path, whereby inputs received by the data path are to be multiplied with one another. A clipping function refers to an ability of the data path to limit the data path output to the maximum value which can be represented by the output data path width; where the two inputs to be multiplied in FIG. 1 exceed the maximum count which can be represented by an output line 6, the output line 6 is clipped to a maximum value whereby all bit locations are represented as "one". A rounding function refers to an ability to round an output of the multiplier up or down to a given number of decimal locations or to an integer value, for example. A truncation function refers to an ability to truncate a number of decimal locations to a predetermined number.

The step of establishing input parameters which identify functional parameters further includes the step of specifying performance parameters of the data path. Performance parameters include identifying the relative importance of the speed of operation of the data path, the overall area required by the design when implemented as an integrated circuit, and the aspect ratio of the data path (i.e., geometrical shape of the overall area required by the circuit layout). In some situations, a designer may wish to increase speed of operation at the expense of increasing circuit size. In other situations, size may be the primary constraint, with the speed of operation being less significant. In accordance with the present invention, different implementations which represent different tradeoffs between speed of operation and size can be easily achieved by merely changing the input parameter to the compiler. A complete re-design of the circuit by the designer, as required when using conventional compilers, is thereby avoided.

As illustrated in FIG. 1, a multiplication data path is to be compiled with a first input 2 which receives bit locations 4 through 30 of a data word. A second input 4 receives bit locations 2 through 28 of a second data word input to the data path. An output 6 is designated to include locations 8 through 31 of a data word. While other bit locations may exist in each of the input and output words, it is only the bit locations designated by the user which are to be operated upon by the data path defined in FIG. 1. For example, the bit locations 0 through 3 of the first data input 2 may be routed to another data path of the circuit layout, with only bit locations 4 through 30 being routed to the data path specifically shown in FIG. 1.

FIG. 1 shows that the multiplication data path includes a control path portion 8 and a data path portion 10 which are interconnected. Details of the data path portion 10, as compiled in accordance with an exemplary embodiment of the invention, are illustrated in FIG. 2. Details of a control path portion, as compiled in accordance with an exemplary embodiment of the present invention are illustrated in FIG. 3. A discussion of the synthesis of the FIG. 2 data path and the FIG. 3 control logic in response to establishment of the high level input parameters described above will now be discussed.

As shown in FIG. 2, the designer has specified input parameters (which are shown as the bracketed information) for a two input multiplier with a clipped output and with convergent rounding. The designer has specified signed inputs (i.e., $S_i$=two's complement (t)) and a signed output (i.e., $S_o$=t). The designer has further specified that high speed operation is not critical since only two inputs are to be combined. Based on these input parameters, a compiler in accordance with the present invention can produce the FIG. 2 data path, the FIG. 3 control logic and a netlist of all interconnections required for implementing the circuitry of FIGS. 2 and 3.

Netlist connectors between the FIG. 2 data path and the FIG. 3 control logic are similarly labeled in FIG. 1. In this exemplary abbreviated nomenclature, "CIN" refers to a control signal (e.g., a multiplier control signal or a carry-in signal from an adder such as a rounding adder), "F" refers to a formatting block, "RH" refers to a rounding handler used to implement a rounding function, "COUT" represents a control signal (e.g., the rounding adder carry-out pin), "OVR" represents an overflow signal (e.g., overflow in the multiplier or in an adder), "OH" represents overflow handling, "ZD" represents a zero detector output (e.g., logic level high if all bit lines are logic low), "OD" represents a "ones" detector output (e.g., logic high if all bit lines are logic high), "S" represents a swizzle (to be discussed below) and "MUX" represents a multiplexer. Any bracketed numbers refer to bit lines of a data bus.

As referenced herein, a swizzle represents a data path element which can connect any bit line of its output bus to any bit line of its input bus, or which can set any of its output bit lines to logic zero or to logic one. Thus, the swizzle can re-format the bit lines of an input bus to create an output bus having any number of bit lines connected to ground, (e.g., logic zero), logic high or it can connect any of its output lines to any particular input line to reconfigure bit locations (e.g., reverse bit order of the input bus or relocate a decimal point position).

Operation of a multiplier compiler will be discussed with respect to the flow charts of FIGS. 4(a)–(d). In accordance with the present invention, the compiler accesses a data path library to produce the data path of FIG. 2 and the attendant control logic of FIG. 3. In the library, data path components are represented as components, or instances, of high-level multiplexers, multipliers, coefficient multiplier modules, adders, absolute value modules, comparator modules, clippers, rounding circuitry and so forth (e.g., Boolean representations). This process of accessing an instance in the library is typically referred to as "instantiating". Once a data path netlist is established based on high level inputs in accordance with the present invention (including all Boolean logic functions and node interconnections), a gate level implementation can easily be obtained by translating the resultant information into a low-level transistor gate level netlist.

As illustrated in FIG. 4(a), the compiler determines the maximum data path width (DPW) and data path decimal point position (DPP) from input and output formats (i.e., the bracketed information of FIG. 2) specified by the designer (block 202). After the compiler derives $L_i$, $R_i$, $L_o$ and $R_o$ for I/O formatters (e.g., swizzles) from DPW, DPP and I/O formats (block 204), it combines all necessary I/O formatters with the primary computing element (e.g., the primary multiplier 16 of FIG. 2 for performing a primary function of the circuit) as illustrated in flow chart blocks 206–212 of FIG. 4(a).

A significant feature of exemplary embodiments is that the selection of data path components further includes automatically selecting overflow detection for the multiplier data path component if a clipping function is specified (see the FIG. 4(b) flow chart). As illustrated in FIG. 4(b), instances used to format the primary multiplier output are selected from the data path library on the basis of whether a clip or a wrap-around function is selected, and on the basis of $L_i$, $L_o$, $S_i$ and $S_o$, as will be described with respect to an exemplary library of instances illustrated in FIGS. 6(a)–(l). Generally speaking, if a wrap-around function is selected (decision block 214), one of the functions 216, 218 or 220 is selected based on values of $L_i$ and $L_o$ (as will be more clear from FIG. 6). If a clip function is selected, one of the formatting functions 222–238 is selected based on values of $L_i$, $L_o$, $S_i$ and $S_o$ (with "u" representing an unsigned condition and S representing the signed condition of a two's complement format) as will be more clear from a discussion of FIG. 6.

Further, a data path component is selected with attendant overflow detection if any formatting, clipping, rounding or truncating functions are specified (see the FIG. 4(c) flow chart). These data path instances are selected from a library of instances illustrated in FIGS. 5(a)–5(j) on the basis of $R_i$, $R_o$, $S_i$, $S_o$ and the functional parameters specified (i.e., clipping, rounding and so forth). The functions selected via blocks 240 to 256 of FIG. 4(c) will become more clear from a discussion of FIG. 5. For example, where a rounding function is designated, the output from the multiplier must be detected and formatted so that the appropriate rounding can be performed (see the FIG. 4(d) flow chart). If a clip function has been specified, overflow handling for the rounding adder is then automatically selected (see blocks 255–256 in FIG. 4(c) and blocks 258–266 of FIG. 4(d)).

After a data path and control path are assembled by the compiler, a traditional translation technique can be used to convert the data path and control path netlist into a gate level implementation of the circuit layout for fabrication on silicon.

As mentioned above, FIGS. 5(a)–(j) and 6(a)–(l) illustrate different high-level data path instances designed in accordance with an exemplary embodiment of the present invention and accessed by the compiler to assemble the more detailed data path of FIG. 2 in response to the input parameters. For example, FIGS. 5(a) and 5(b) represent instances for formatting the data path inputs and outputs. As illustrated in FIG. 5(a), the compiler determines if the least significant bit location of the designated input (i.e., bit location $R_i$) of a given instance is greater than or equal to the least significant bit location at the output of the instance (represented as bit location $R_o$). If $R_i$ is greater than $R_o$, a swizzle is selected to render the input and output formats compatible (see FIG. 5(a)).

If the least significant bit position at an input ($R_i$) is greater than the least significant bit at the output ($R_o$), the swizzle of FIG. 5(a) operates on the bit range from $L_i$ through $R_i$ and fills the output bit locations between bit location $R_i$ minus one (i.e., ($R_i$–1)) and $R_o$ with logic low values (abbreviated in FIG. 5(a) with the letter "l") representing, for example, logic zero (0). For example, if the desired bit locations of a 20 bit input to a given instance are designated by locations 12 through 31, while the desired bit locations of a 22 bit output of the instance are designated 10 through 31, $R_i$ is 12, $R_o$ is 10 and ($R_i$–$R_o$) is 2. Thus, bit locations 10 and 11 at the output are driven low (e.g., "0") by a swizzle. Output bit locations of less significance than $R_o$ (i.e., bit locations 9 through 0) are considered floating, as represented by the designation $R_o$–"".

If the bit position of $R_i$ is equal to $R_o$, the input and output can be interconnected by a straight wire, as illustrated in FIG. 5(b). No swizzle is required for such I/O formatting.

FIGS. 5(c)–(h) illustrate data path components stored in a library of the inventive compiler for implementing different modes of rounding. In an exemplary embodiment, six different rounding modes can be selected by the designer: truncate, rounding toward plus (+) infinity, rounding toward zero if input is signed (i.e., zero (signed)), rounding toward zero if input is unsigned (i.e., zero (unsigned)), normal rounding, and convergent rounding. The type of rounding selected by the user determines which of the data path instances shown in FIGS. 5(c)–(h) will be selected.

If truncate rounding is selected, an input bit range corresponding to the most significant bit position of the input ($L_i$) through the input bit position which corresponds to the least significant bit ($R_o$) of the output are applied to a swizzle. All bit locations of the input which are of less significance than $R_o$ are truncated as floating bits (represented by the symbol $R_o$–) using a swizzle as illustrated in FIG. 5(c). For example, if the least significant bit location for the input is bit location 7, the 7 least significant bit locations of the output are considered floating.

For rounding toward + infinity, an adder data path component such as adder 3 of FIG. 5(d) is used. For a bit range from $L_i$ through $R_i$, bits of less significance than $R_i$ are floated using a first swizzle 5. A second swizzle 7 is provided at a second connection to the adder 3 for setting bit locations $L_i$ through ($R_o$+1) inclusive low (i.e., logic zero), bit locations $R_o$ to $R_i$ inclusive (designated ($R_o$–$R_i$) in FIG. 5) high (i.e., logic 1) and bit locations of less significance than $R_i$ floating. Thus, starting from the least significant bit, the second input of the + infinity adder floats all bit locations less than $R_i$, assigns logic level 1 to all bit locations between $R_o$ and $R_i$ inclusive, and assigns logic level zero to all bit locations between $L_i$ and ($R_o$+1). As illustrated in FIG. 5(d), the adder 3 bears the designation "S" representing that the adder is a relatively slow speed device (i.e., a high speed adder is unnecessary, but could be selected if desired).

For zero (signed) rounding, an adder 3 is again used, as illustrated in FIG. 5(e). The two inputs to the adder are tied together, and each includes a swizzle. A first input to the adder includes a swizzle which, for the bit range $L_i$ through $R_i$, floats all bit locations of less significance than $R_i$. The swizzle placed in the second input to the adder assigns all bit locations of less significance than $R_i$ floating, assigns all bit locations between $R_o$ and $R_i$ inclusive (i.e., $R_o$–$R_i$) with the logic level of bit location $L_i$, and assigns a logic level low to bit locations ($L_i$–$R_o$=1).

A data path component for providing zero (unsigned) rounding includes a swizzle which, for a bit range of from $L_i$ through the input bit location corresponding to $R_o$, floats all bit locations of less significance than $R_o$. This is represented in FIG. 5(f) via use of a swizzle.

Normal rounding is achieved via use of an adder data path component with both inputs being connected via swizzles. As shown in FIG. 5(g), a first input assigns, for a bit range from bit location $L_i$ through bit location ($R_o$–1), a floating value for all bit locations of less significance than ($R_o$–1). The second input to the adder of FIG. 5(g) floats all bit locations of less significance than ($R_o$–1), and assigns a logic level high (i.e., logic "1") to the bit locations ($L_i$–$R_o$+1). In all cases mentioned above and described below, a floating condition refers to a connection for an output bit line of the swizzle being left open (i.e., unconnected).

FIG. 5(h) illustrates a data path component for implementing convergent rounding. Again, an adder 3 is provided having two inputs, each of which includes a swizzle 9. The upper input to the adder assigns, for a bit range from bit location $L_i$ through bit location ($R_o$–1), a floating value to bit locations of less significance than ($R_o$–1). The input to the swizzle 9 is also routed to a second swizzle 11 which, for bit locations ($R_o$–2) through $R_i$ detects whether these bit locations are all zero via a zero detector. A NAND gate 13 receives the output from the zero detector, receives the logic level value of the bit location ($R_o$–1) and receives an inverted logic level of the bit location $R_o$. The output of the NAND gate 13 is assigned to the bit location ($R_o$–1) for the second input of the adder 3 in FIG. 5(h). A swizzle 15 assigns bit locations of less significance than ($R_o$–1) floating, assigns the bit location $R_o$–1 to the output of the NAND gate 13, and assigns the bit locations $L_i$ through ($R_o$+1) to logic level low (i.e., logic level zero).

FIGS. 5(i) to 5(j) illustrate data path instances for producing signed and unsigned clipping functions for clipping in the event of overflow. Where the instance representing the primary function of the data path requires clipping (as with FIG. 2), the signed or unsigned clipping instance of FIG. 5(i) or 5(j) is cascaded with this instance. Further, all rounding instances that require an adder (i.e., FIGS. 5(d), 5(e), 5(g) and 5(h)) are cascaded with at least one of the signed and unsigned clipping data path components illustrated in FIGS. 5(i) to (j) when a clipping parameter has been specified by the designer.

Referring to FIG. 5(i), an exclusive OR gate 17 receives control signals from the primary functional component (e.g., the primary data path multiplier or one of the adders illustrated in FIGS. 5(d), (e), (g) or (h). The two control signals include a control output (i.e., COUT) and overflow (OVR) signals. The output from the exclusive OR gate 17 is used to control a multiplexer 19 which receives two inputs. A first input to the multiplexer 19 is an output from the primary functional component (e.g., multiplier 16). A second input includes a swizzle for floating input bit locations of less significance than $R_o$, and for assigning bit locations ($L_i$–$R_o$) logic level high. The latter input is gated to the multiplexer output when the output of exclusive OR gate 17 is logic high. An output swizzle is provided which, for bit locations $L_i$ through $R_o$, assigns all bit locations of less significance than $R_o$ floating. Only positive overflow can occur from rounding.

The data path component for unsigned inputs as illustrated in FIG. 5(j) also includes a multiplexer 21 which is controlled by a control signal of the functional component being used (e.g., adder). The multiplexer 21 includes two inputs, a first of which is the output from the functional component, and a second of which includes a swizzle. The input swizzle renders bit locations of less significance than $R_o$ floating, and assigns bit locations ($L_i$–$R_o$+1) logic level high when the control signal is high.

The control logic components of FIGS. 6(a) to 6(l) represent formatting instances which constitute stored library components that are accessible by the compiler based on user specified inputs. The user specified inputs include designations as to whether the input and output of the component used for performing the primary function of the circuit are to be unsigned (i.e., u) or in two's complement format (i.e., t). Further, the user must specify the bit location of the most significant bit for both the input and the output of the adder (i.e., $L_i$ and $L_o$). Although the exemplary data path components of FIG. 6 are provided for a clipping function, formatting for a wrap-around function (i.e., non-clipped wrap-around versions) can be easily implemented. For example, all logic elements associated with the multiplexer shown in FIGS. 6(a) through 6(l) are simply removed for wrap-around versions.

The first column of FIG. 6, which includes FIGS. 6(a), 6(d), 6(g) and 6(j), represents control logic and data path components for clipping where the most significant bit location of the input (i.e., $L_i$) is greater than the most significant bit location of the output (i.e., $L_o$). The four conditions illustrated in FIG. 6 are represented by the four rows of control logic components, and include conditions where: (1) an input is unsigned (i.e., $S_i$=u) and an output is unsigned (i.e., $S_o$=u); (2) $S_i$ is unsigned and $S_o$ is in two's complement format (i.e., $S_o$=t); (3) $S_i$ is two's complement format, $S_o$ is unsigned; and (4) $S_i$ and $S_o$ are two's complement format.

The second column of FIG. 6, which includes FIGS. 6(b), 6(e), 6(h) and 6(k), illustrates the four conditions described above where $L_i$ is equal to $L_o$. The final column of FIG. 6, which includes FIGS. 6(c), 6(f), 6(i) and 6(l), represents control logic components for the four conditions described above where $L_i$ is less than $L_o$.

Using the same nomenclature as described above with respect to FIG. 5, the control features provided by each of the control logic components illustrated in FIG. 6 is readily apparent. For example, where $S_i$ and $S_o$ are both selected to be unsigned by the designer, and where the designer has selected $L_i$ to be greater than $L_o$, the compiler would select the instance and associated control logic of FIG. 6(a). FIG. 6(a) illustrates use of a first swizzle where the range of bit locations from $L_i$ through the bit location ($L_o$+1) are assigned to a zero detector input. The output of the zero detector is used to control a multiplexer 21 which receives two inputs. The first of these inputs includes a swizzle for assigning bit locations $L_o$ through $R_o$ to a logic level high (i.e., 1) and assigning all input bit locations of less significance than $R_o$ floating when bit locations $L_i$ through ($L_o$+1) have been detected as logic low. A second input of the multiplexer receives the input directly if $L_i$ and ($L_o$+1) are not both zero. An output swizzle, for the range of bit locations $L_o$ through the bit location $R_o$, assigns all bit locations of less significance than $R_o$ floating.

Turning back to FIGS. 2–3, the designer has selected that two inputs be combined via a slow speed, clip multiplier with convergent rounding to produce a single output only 24 bits wide (8 bits being assigned to an integer portion of the data output). A signed output and signed inputs, both in two's complement format, were specified. Despite the word length of the inputs INP1 and INP2 at input locations 2 and 4 of the FIG. 2 data path, the data path and associated control logic assembled by the compiler will produce an output which is determined by the user specified output data format.

An implementation of a circuit designed using the compiler library components described above will now be discussed. In FIG. 2, the compiler has determined DPW as 32 and DPP as 24 (i.e., 24 bit locations are used to define the fractional portion of a decimal number). Since the overall data path is limited to 32 bits wide with DPP=24, up to 8 bit locations can be used to represent an integer portion of the decimal number, with these eight bit locations including a sign bit (i.e., bit locations 31 to 24 can be used to represent the integer portion of the decimal value). Bit locations 23 through 0 can be used to represent the fractional portion of the decimal number.

Recognizing that the inputs 2 and 4 of FIG. 1 include different word lengths and different DPP's, the compiler automatically uses formatting swizzles (see FIG. 5(a)) to render the format of these two inputs compatible for input to the primary functional component (i.e., multiplier 16). To align bit locations (i.e., align decimal points) of the two inputs, swizzles 12 and 14 are provided in each of the input lines to multiplier 16 which then multiplies the two inputs.

In the exemplary FIG. 2 data path, the user has specified that the first input 2 is to be a signed, fixed point number (i.e., fixed decimal point) 27 bits wide, with 7 of these 24 bits being assigned to the integer. The second input 4 is a signed input 27 bits wide, with 5 bits being assigned to the integer portion. The user has specified that the single output 6 be signed and 24 bits wide, with 8 bits assigned to the integer portion. If the designer has not specified high speed performance, the compiler defaults to using a slow speed "S" multiplier from the data path library.

Recognizing that the designer has selected a clipping function for a multiplier circuit, the compiler automatically selects a multiplier instance (i.e., multiplier 16 with output swizzles 21 and 23) and a multiplexer 18 to account for overflow conditions (i.e., corresponding to the signed clipping instance of FIG. 5(i)). Output formatting for the multiplier is provided via swizzles 21 and 23. The swizzles are included in a data path library with the multiplier instance. Because the output bit lines of a multiplier can equal the total of all input lines to the multiplier, swizzles 21 and 23 allow the number of bit lines into multiplexer 18 to be selected. For example, if two 8 bit inputs to the multiplier produce a 16 bit output (8 most significant bit lines and 8 least significant bit lines), swizzle 21 could select 4 of the most significant bit lines and swizzle 23 could select 4 of the least significant bit lines to provide an 8 bit input to multiplexer 18.

Control logic of FIG. 5(i) is used to control multiplexer 18 as illustrated in FIG. 3. When the multiplication performed by the FIG. 2 multiplier 16 results in the multiplier exceeding its maximum value such that output of the multiplier would roll over (i.e., overflow), this condition is detected by the control logic via zero detector 24 and used to activate multiplexer 18 so that the output line 26, which can include bit lines of a most significant byte line 17 and/or a least significant byte line 19, is clipped to a maximum value (i.e., most significant bit, or MSB, being zero and all other bits being one on the data output from the multiplier 16). A swizzle 28 has the MSB connected to the ground and other input lines connected to a power supply to create this maximum value as an input to multiplexer 18. Thus, by merely specifying the inputs to be combined, and selecting slow speed operation, a compiler in accordance with the present invention has assembled the formatting, multiplication and clipping functions, along with any necessary control logic, to produce an output on data line 26 of FIG. 2 which accurately reflects a properly formatted, clipped multiplication function.

As mentioned above, the designer has specified convergent rounding as an input functional parameter for the FIG. 2 data path. Once instances which provide a clipped multiplication output on data line 26 have been compiled, a swizzle 30 can be selected for input to a convergent rounding adder 32 which is automatically selected by the compiler from the library (i.e., the convergent rounding instance of FIG. 5(h)). The control logic of FIG. 5(h) is included in the control logic shown in FIG. 3.

In an exemplary embodiment, the rounding adder 32 is used to add or subtract from the value on data line 26 so that the value on line 26 can be rounded up or down. A fixed amount by which the value on data line 26 is to be incremented or decremented is input via swizzle 34 from an input 36 which is controlled by the FIG. 3 control logic based on the value detected from line 26 via control output 20 (i.e., a bit extractor for extracting bit locations 7 and 8 for input to the FIG. 3 control logic) and from an output of zero detector 24 (also input to the FIG. 3 control logic). For example, if the value on line 26 can be correlated to a decimal value of 8.5, the adder 36 would subtract 0.5 from this value for convergent rounding to the integer value present on data line 26. (This can be contrasted with conventional rounding, where 8.5 would be rounded up to 9 by adding a fixed value of 0.5, followed by truncation of the rounding adder output to the nearest integer). Again, because slow speed performance is permissible for the data path, the compiler automatically selects the adder 32 as a slow speed "S" adder.

Further, the compiler automatically selects another multiplexer 38 (e.g., data path instance of FIG. 5(i)) to clip the FIG. 2 rounding adder 32 since a clipped output was specified for the data path. As with the multiplexer 18, a swizzle 40 is provided as the second input to the multiplexer 38, with the swizzle 40 being used to provide a maximum value in the event the rounding adder 32 overflows. The multiplexer 38 places either the output from the rounding adder 32 or, in an overflow condition, the maximum value from the swizzle 40 on an output data line 42. This output is passed through a series connected swizzle 44 which is included in the output of the FIG. 5(i) instance.

A second swizzle 46 (corresponding to the data path instance of FIG. 6(l)) is provided in the data path output to convert the rounding adder output to a final output format designated by the designer. As mentioned with respect to FIG. 3, the output has been selected as a 24 bit signed output with 8 bits assigned to the integer value. Because $S_i=t$, $S_o=t$ and $L_i$ is less than $L_o$ for the data path (i.e., $L_o=24$ and $L_i=27$), the swizzle 46 provides the function of FIG. 6(l).

As mentioned previously, a compiler in accordance with the present invention not only assembles data path components into the data path, but in addition selects appropriate control logic for the data path. As shown in FIG. 3, control logic includes four basic control paths for controlling the data path instances selected by the compiler to implement the FIG. 2 data path functions.

Because each of the FIG. 2 functional components 16 and 32 only receive two inputs (i.e., no cascading of multipliers or adders), no carry-out capability is provided. Accordingly, the compiler places the carry-in to each of these components at ground ($V_{ss}$) via a first control path 48 of FIG. 3.

As discussed with respect to FIG. 2, the adder 32 is provided for rounding, and the compiler automatically provides overflow protection via the multiplexer 38 and swizzle 40. The control logic for detecting an overflow condition and for controlling the multiplexer 38 is illustrated by the control path 50 in FIG. 3 which corresponds to the FIG. 5(i) control logic for a signed output. If a carry-out of the FIG. 2 rounding adder 32 goes high, or if an overflow condition is detected, an exclusive OR gate 52 of FIG. 3 controls the FIG. 2 multiplexer 38 to select the maximum clip value via swizzle 40.

A similar FIG. 3 control path 54, also corresponding to the FIG. 5(i) instance, is provided for detecting a carry-out from the multiplier 16 or an overflow condition with respect to the multiplier 16 to gate the multiplexer 18 so that it provides a maximum clip value via the swizzle 28.

A fourth control path 58 is also selected by the compiler to control the convergent rounding adder, and includes a NAND gate 60 and a NOT gate 62 (corresponding to the control logic of the convergent rounding instance shown in FIG. 5(h)). The control path 58 provides an input to the rounding adder 32 via the swizzle 34 to produce the convergent rounding feature noted above (i.e., the FIG. 2 swizzle 34 corresponds to the swizzle 15 in FIG. 5(h)).

To illustrate the flexibility of compilers designated in accordance with the present invention, an additional data path and control path created by a coefficient compiler designed in accordance with the present invention will be discussed with respect to FIGS. 7 through 9. Generally speaking, a coefficient compiler performs multiplication of an input or inputs by a fixed constant designated by the designer. The FIG. 7 example reflects that the designer has selected a first input 70 having 11 bit locations designated 12 through 22. Although not illustrated in FIG. 7, the designer has specified that the multiplication coefficient is to be an unsigned, 21 bit value with a 5 bit integer. An output is provided with 14 bit locations (i.e., locations 8 through 21) of an output bus.

As shown in FIG. 7, the input 70 and the output 74 are illustrated with respect to a data path 76 and attendant control logic 78. The data path 76 is illustrated in greater detail in FIG. 8, while the control logic is illustrated in greater detail in FIG. 9.

As illustrated in FIG. 8, the designer has specified that a clip function is to be implemented for the coefficient module. The designer has also selected a normal rounding function. Based on the user specified input and output, as designated by the bracketed information in FIG. 8, the compiler determines that the maximum data path width is 24 bits with a decimal position at bit location 16. Thus, bit locations 23 through 16 can be used to represent an integer portion of the decimal number, and bit locations 15 through 0 can be used to represent the fractional portion of the number.

Based on the established input parameters, a compiler in accordance with the present invention formats the first input 70 as an 11 bit signed input with a 7 bit integer value. The input 70 is applied to a swizzle 80 for input formatting, so that both inputs are converted to a signed input with their DPP's aligned for coefficient multiplication in a slow performance coefficient module 84. As with the previous multiplier example, the compiler automatically provides output formatting for the coefficient module via swizzles 83 and 85. Because multiplication can double the number of output lines relative to the multiplier input lines, swizzles 83 and 85 permit a number of bit lines to be selected from the most significant bit lines and the least significant bit lines for input to an overflow detector. Overflow detection is provided via a multiplexer 86 and a swizzle 88 (i.e., the data path element of FIG. 5(i)).

As mentioned above, the designer has selected a normal rounding function. Accordingly, an output from the multiplexer 86 is provided to a swizzle 90 to extract the necessary bits needed for a rounding operation (see FIG. 5(g)). A second swizzle 92 creates a constant which can be combined with the output from swizzle 90 to provide conventional rounding of the output from the coefficient module 84. In a normal rounding mode, a decimal value of, for example, 8.5 would be rounded to 9.0 by adding a fixed value of 0.5 via swizzle 92 and truncating the result to its integer value. Again, because an adder was selected by the compiler from the data path library to perform a rounding function, an overflow protection for this adder is automatically selected as represented by multiplexer 96 and swizzle 98 (data path instance of FIG. 5(i)). An output of the multiplexer 96 is provided to a swizzle 100 for bit extraction (i.e., output formatting), since all bits produced by the rounding adder can not be represented in the 14 bit output 74.

A final formatting for a signed output is provided via a multiplexer 102 and swizzles 104 and 106. This formatting corresponds to the format data path instance of FIG. 6(j) since $S_i=S_o=t$ and $L_i=21$ while $L_o=14$. Control for the multiplexer 102 is provided via a control path 108 which is used to extract a given bit (i.e., bit location 22). Because the output is a signed, two's complement output (i.e., output 74), a bit extracting swizzle 110 and zero detection 112 are provided, along with a bit extraction swizzle 114 and a "one" detection 116 for use by the FIG. 9 control logic. The control logic signals produced as a result of the control path 108, zero detection 112 and the ones detection 116 are used to regulate the multiplexer 102 to identify positive overflow or negative overflow in formatting the output.

The compiler generates the control logic of FIG. 9 for use with the FIG. 8 data path. A first data path 120 is used to ground the control signals (e.g., carry-in of the rounding adder 94) in the FIG. 8 embodiment since no cascading of adders is required. The second data path 122 clips the coefficient module 84 in a manner similar to that described with respect to FIG. 3 and FIG. 5(i). A data path 124 is used to control the final formatting via the multiplexer 102 based on the outputs from the control path 108, the zero detector 112 and the ones detector 116 (see data path instance of FIG. 6(j)). The control path 124 includes NOR gates 126, 128 and 130, along with a NOT gate 132. The output from the zero detector 112 in FIG. 8 is input to the NOR gate 126, while the output from the ones detector 116 is input to the NOR gate 128. The control path 108 extracts bit location 22 from an output of the swizzle 100. The value of this bit location is applied to the other input of NOR gate 126, and to the other input of NOR gate 128 via the inverter 132. Outputs from the NOR gates 126 and 128 are used to represent the most significant and least significant bits of a control bit string for the multiplexer 102. The second location of this three bit control string is produced by connecting the outputs from the NOR gates 126 and 128 via the NOR gate 130.

The final control path 132 of FIG. 9 is used to clip the rounding adder 94 via multiplexer 96. Again, this control path includes a NOR gate 134 (as described with respect to FIG. 5(i)).

It will be appreciated that while the exemplary embodiments discussed above relate to the automatic compilation of a high-level netlist for a multiplier or coefficient generator circuit in response to high-level input parameters, the present invention can be adapted to the design of compilers for producing any integrated circuit. For example, as described in commonly assigned, co-pending U.S. application Ser. No. 07/975,014 (Attorney Docket No. 1800) entitled "Parameterized Generic Compiler", filed on Nov. 12, 1992, the disclosure of which is hereby incorporated by reference in its entirety, a compiler can be created for producing a high-level netlist associated with an adder circuit. In a manner similar to that described in the co-pending application with respect to an adder compiler, the present invention can be adapted to the design of a comparator compiler or an absolute-value compiler and any appropriate modifications to the data path library can be made to accommodate the compiler operation disclosed herein.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for automatically producing a circuit layout for performing a predetermined operation using a compiler which performs the steps of:

receiving established compiler input parameters;

creating a data path netlist with said compiler based on said established input parameters, said step of creating further including the steps of:

(a) recognizing a data format of at least one data path input;

(b) selecting components from a data path library to correlate the data format of the at least one data path input to the data path;

(c) selecting at least one data path component from the data path library for functional processing of said at least one data path input based on said established input parameters; and (d) selecting at least one control path component based on said selected data path component to control the at least one data path component.

2. A method according to claim 1, wherein said input parameters are established by a designer to identify input/output characteristics of a data path, said method further including a step of:

translating said data path netlist into a gate level implementation of the circuit layout.

3. A method according to claim 2, wherein said establishment of input parameters further includes the steps of:

defining a number of data path inputs and outputs;

defining the number of bits per word for each data path input/output; and defining a data format for each data path word by identifying whether each word is floating point or fixed point and identifying whether each word is signed or unsigned.

4. A method according to claim 2, wherein said established input parameters identify functional parameters of the data path, said method further including the steps of:

specifying high-level functional processing parameters of said data path; and specifying performance parameters of the data path, said performance parameters identifying at least one of speed of operation and size of the data path.

5. A method according to claim 4, wherein said step of specifying desired functional processing parameters further includes the step of:

specifying a function of adding, clipping, rounding or truncation as a high-level functional parameter of the data path.

6. A method according to claim 5, wherein said step of selecting at least one data path component from the data path library further includes the step of:

automatically selecting a data path element for overflow detection if a high-level clipping function is specified.

7. A method according to claim 5, wherein said step of selecting at least one data path component from a data path library further includes the step of:

selecting a high-level rounding adder instance from the data path library and an overflow instance for the rounding adder, if a high-level rounding function is specified.

8. A method according to claim 4, wherein said step of selecting at least one data path component from the data path library further includes the step of:

automatically selecting overflow detection for the data path to accommodate any overflow due to data format conversion based on the number of bits in the input and output words of the data path.

9. A method according to claim 1, wherein said circuit layout includes a coefficient generator.

10. A method according to claim 1, wherein said circuit layout performs a multiplication operation.

11. A method according to claim 1, wherein said circuit layout performs a comparator operation.

12. A method according to claim 1, wherein said circuit layout performs an absolute-value operation.

13. A method for producing a circuit layout for performing a predetermined operation comprising the steps of:

establishing high-level compiler input parameters which identify input/output characteristics and high-level functional parameters of a data path;

inputting said established input parameters to a compiler, said compiler performing the steps of:

creating a high-level data path netlist by automatically selecting high-level data path components from a data path library in response to recognized data formats of said established input parameters, and by automatically selecting control logic in response to said selected data path components for controlling said data path components.

14. A method according to claim 13, wherein said netlist of high-level data path components is a Boolean logic representation of the data path specified by said high-level input parameters, said method further including the step of:

translating said data path netlist into a gate level implementation of the circuit layout.

15. A method according to claim 14, wherein said step of establishing said input parameters further includes the steps of:

defining a number of data path inputs/outputs;

defining a number of bits per word for each data path input/output; and defining a data format for each data path word by identifying a decimal point position for each word and identifying whether each word is signed or unsigned.

16. A method according to claim 15, wherein said established input parameters identify high-level functional parameters of the data path, said method further including the steps of:

specifying high-level functional processing parameters of said data path; and specifying performance parameters of the data path, said performance parameters identifying at least one of speed of operation and size of the data path.

17. A method according to claim 16, wherein said step of specifying desired functional processing parameters further includes the step of:

specifying at least a function of adding, clipping, rounding or truncation as a high-level functional parameter of the data path.

18. A method according to claim 13, wherein said step of creating a data path netlist further includes the step of:

automatically selecting a data path component for overflow detection if a clipping function is specified.

19. A method according to claim 13, wherein said step of creating a data path netlist further includes the step of:

automatically selecting a rounding adder component from the data path library, with an element for overflow detection of the rounding adder, if a rounding function is specified.

20. A method according to claim 13, wherein said step of creating a data path netlist further includes the step of:

selecting an overflow detection for the data path to accommodate data format conversion based on a number of bits in the input and output words of the data path.

21. A method according to claim 13, wherein said circuit layout includes a coefficient generator.

22. A compiler for producing a circuit layout that performs a predetermined operation, the compiler comprising:

a compiler input for receiving high-level input parameters which identify input/output characteristics and high-level functional parameters of a data path; and a compiler library of data path components for creating a high-level data path netlist by automatically selecting high-level data path components from the data path library in response to recognized data formats of the high-level input parameters, and by automatically selecting control logic in response to said selected data path components for controlling said data path components.

23. A compiler according to claim 22, wherein said high-level input parameters include:

a defined number of data path inputs and outputs;

a defined number of bits per word for each data path input/output; and a defined data format for each data path word to identify whether each data path word is floating point or fixed point and whether each word is signed or unsigned.

24. A compiler according to claim 23 wherein said high-level input parameters further include:

high-level functional processing parameters of the data path; and performance parameters of the data path to identify at least one of speed of operation and size of the data path.

25. A compiler according to claim 24, wherein said library of data path components further include:

a data path element which can connect any bit line of its output bus to any bit line of its input bus, and which can set any of its output bit lines to logic zero or to logic one.

* * * * *